US009696395B2

(12) United States Patent
Kim et al.

(10) Patent No.: US 9,696,395 B2
(45) Date of Patent: Jul. 4, 2017

(54) MAGNETIC RESONANCE IMAGING (MRI) SYSTEM AND METHOD

(71) Applicant: Samsung Electronics Co., Ltd., Suwon-si (KR)

(72) Inventors: Young-beom Kim, Yongin-si (KR); Yeun-chul Ryu, Hwaseong-si (KR); Jae-mock Yi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 771 days.

(21) Appl. No.: 14/064,374

(22) Filed: Oct. 28, 2013

(65) Prior Publication Data
US 2014/0210465 A1 Jul. 31, 2014

(30) Foreign Application Priority Data
Jan. 29, 2013 (KR) ........................ 10-2013-0010098

(51) Int. Cl.
*G01R 33/36* (2006.01)
*G01R 33/3415* (2006.01)

(52) U.S. Cl.
CPC ...... *G01R 33/3635* (2013.01); *G01R 33/3415* (2013.01)

(58) Field of Classification Search
CPC .......................... G01R 33/3635; G01R 33/3415
See application file for complete search history.

(56) References Cited

U.S. PATENT DOCUMENTS

| 8,049,496 B2 | 11/2011 | Chen et al. |
| 2009/0222069 A1* | 9/2009 | Petersen ................ C12N 13/00 607/89 |
| 2013/0043868 A1* | 2/2013 | Hwang .............. G01R 33/4828 324/309 |
| 2013/0119987 A1* | 5/2013 | Felmlee ........... G01R 33/34092 324/322 |

FOREIGN PATENT DOCUMENTS

| KR | 2002-0092421 | 12/2002 |
| KR | 10-2004-0080371 | 9/2004 |
| KR | 10-2005-0049398 | 5/2005 |
| KR | 10-2008-0111338 | 12/2008 |

* cited by examiner

*Primary Examiner* — Rodney Bonnette
(74) *Attorney, Agent, or Firm* — NSIP Law

(57) ABSTRACT

Provided are apparatuses and methods for magnetic resonance imaging (MRI). The magnetic resonance imaging (MRI) method includes applying radio frequency (RF) pulses to an object in a magnetic field, the RF pulses having different frequency bands for each of at least two types of nucleus in the object; applying predetermined pulse sequences for each type of nucleus to the object; receiving magnetic resonance signals emitted by each nucleus in response to the RF pulses and the predetermined pulse sequences; and generating an image of the object based on the received magnetic resonance signals.

20 Claims, 5 Drawing Sheets

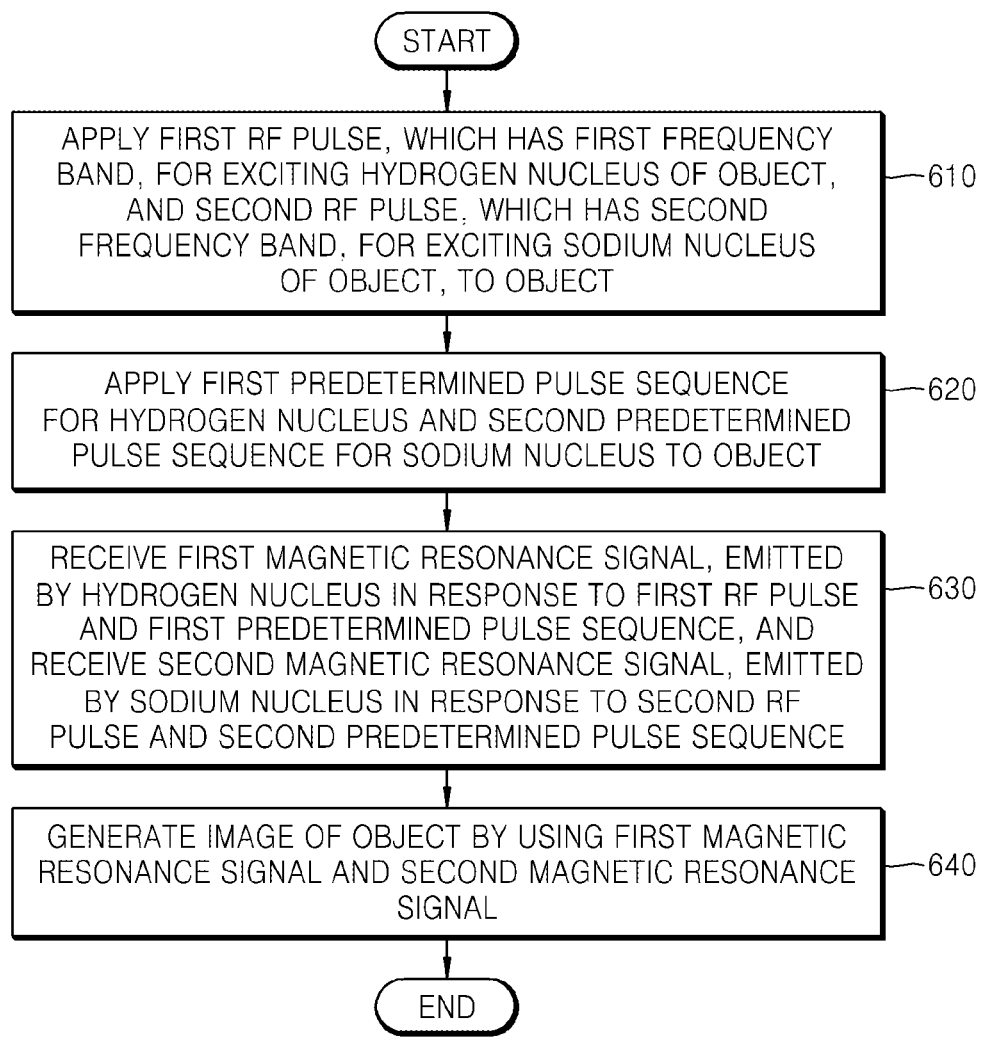

MAGNETIC RESONANCE IMAGING (MRI) SYSTEM AND METHOD

CROSS-REFERENCE TO RELATED APPLICATION

This application claims the benefit under 35 U.S.C. §119(a) of Korean Patent Application No. 10-2013-0010098, filed on Jan. 29, 2013, in the Korean Intellectual Property Office, the entire disclosure of which is incorporated herein by reference for all purposes.

BACKGROUND

1. Field

The following description relates to apparatuses and methods for magnetic resonance imaging (MRI).

2. Description of the Related Art

A magnetic resonance imaging (MRI) system obtains an image of tissues of a human body, by using nuclear magnetic resonance (NMR) of nuclei in the human body. The MRI system obtains an image by applying a magnetic field to nuclei in the human body. The MRI system may non-invasively obtain an image, which includes information about the tissue of an object. Unlike other image equipment, the MRI system may non-invasively obtain a high-resolution image of tissue, without having to use radioactivity. Thus, the MRI system has wide application in the field of medicine. Recently, the MRI system has also been used for functional MRI (fMRI) for analyzing information about a brain function. It is increasingly becoming important to obtain additional kinds of information using the MRI system.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a magnetic resonance imaging (MRI) method includes applying radio frequency (RF) pulses to an object in a magnetic field, the RF pulses having different frequency bands for each of at least two types of nucleus in the object; applying predetermined pulse sequences for each type of nucleus to the object; receiving magnetic resonance signals emitted by each nucleus in response to the RF pulses and the predetermined pulse sequences; and generating an image of the object based on the received magnetic resonance signals.

The applying of the RF pulses may include applying the RF pulses for each type of nucleus through each channel of multi-channel RF transmitting (Tx) coils.

The applying of the RF pulses may include simultaneously applying the RF pulses through multi-channel RF transmitting (Tx) coils.

The receiving of the magnetic resonance signals may include receiving the magnetic resonance signals for each type of nucleus, through each channel of multi-channel RF receiving (Rx) coils.

The receiving of the magnetic resonance signals may include receiving the magnetic resonance signals through RF receiving (Rx) coils; and separating the received magnetic resonance signals into a plurality of magnetic resonance signals corresponding to each type of nucleus, based on frequency bands of the received magnetic resonance signals.

The multi-channel RF Rx coils may have a form of fractals.

A frequency band corresponding to each type of nucleus may be determined based on an intensity of a static magnetic field applied to the object and a gyromagnetic ratio of each types of nucleus.

The predetermined pulse sequences may include at least one of a frequency encoding pulse or a phase encoding pulse.

The phase encoding pulse may include at least one of a phase encoding pulse along the direction of a Y-axis or a phase encoding pulse along the direction of an X-axis.

A non-transitory computer-readable recording medium having thereon a program to executed the magnetic resonance imaging (MRI) method.

According to another aspect, there is provided a magnetic resonance imaging (MRI) apparatus includes a controller configured to determine pulse sequences applied to an object placed in a magnetic field; a radio frequency (RF) transmitting (Tx) coil configured to apply RF pulses having different frequency bands for each of at least two different type of nucleus of the object; an RF receiving (Rx) coil configured to receive magnetic resonance signals emitted by each type of nucleus in response to the RF pulses and the pulse sequences; and a signal processor configured to process the magnetic resonance signals received from the RF Rx coil.

The RF Tx coil may include multi-channel RF Tx coils, and the RF Tx coil may be configured to apply the RF pulses for each type of nucleus through each channel of the multi-channel RF Tx coils.

The RF Tx coil may include multi-channel RF Tx coils, and the multi-channel RF Tx coils may be configured to simultaneously apply the RF pulses having different frequency bands corresponding to each type of nucleus.

The RF Rx coil may include multi-channel RF Rx coils, and the RF Rx coil may be configured to receive the magnetic resonance signals for each type of nucleus through each channel of the multi-channel RF Rx coils.

The RF Rx coil may include multi-channel RF Rx coils, the RF Rx coil may receive the magnetic resonance signals through the multi-channel RF Rx coils, and the signal processor may be further configured to separate the received magnetic resonance signals into a plurality of magnetic resonance signals corresponding to each type of nucleus, based on frequency bands of the received magnetic resonance signals.

The multi-channel RF Rx coils may have a form of fractals.

The signal processor may separate the received magnetic resonance signals into a plurality of magnetic resonance signals using filters.

According to another aspect, there is provided a magnetic resonance imaging (MRI) system includes an MRI apparatus configured to apply radio frequency (RF) pulses having different frequency bands for each of at least two type of nucleus to an object in a magnetic field, to apply predetermined pulse sequences for each type of nucleus, and to receive magnetic resonance signals emitted by each type of nucleus in response to the RF pulses and the predetermined pulse sequences; and an image processing device configured to generate an image of the object based on the received magnetic resonance signals.

Other features and aspects will be apparent from the following detailed description, the drawings, and the claims.

BRIEF DESCRIPTION OF THE DRAWINGS

FIG. 6 is a diagram illustrating an example of a MRI method.

Figure 1:
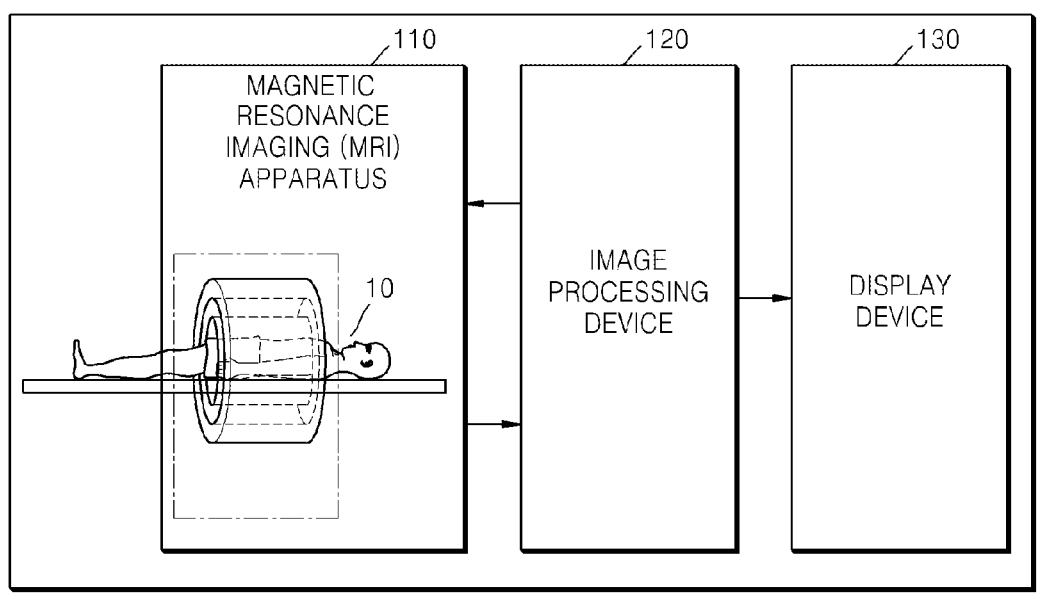
FIG. 1 is a diagram illustrating an example of a magnetic resonance imaging (MRI) system.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be apparent to one of ordinary skill in the art. Also, descriptions of well-known functions and constructions may be omitted for increased clarity and conciseness FIG. 1 is a diagram illustrating an example of a magnetic resonance imaging (MRI) system 100. Referring to FIG. 1, the MRI system 100 includes an MRI apparatus 110, an image processing device 120, and a display device 130. Unlike the illustration shown in FIG. 1, the devices that constitute the MRI system 100 may be included as an apparatus in integrated form. In FIG. 1, the MRI system 100 is illustrated to include the display device 130. However, the MRI system is not limited thereto, and the display device 130 may be provided outside the MRI system 100. Only components related to the present example are illustrated in the MRI system 100 of FIG. 1. Thus, those skilled in the art may understand that general components except for components illustrated in FIG. 1 may be further included.

The MRI system 100 obtains an image that includes information about tissue of an object in a non-invasive manner by using a magnetic field. The MRI system 100 may be a hybrid MRI system in which the MRI system and another medical imaging device such as a positron emission tomography (PET) device are combined.

The MRI apparatus 110 subjects an object 10 to a high-frequency magnetic field. After applying the high-frequency magnetic field, the MRI apparatus 110 obtains a magnetic resonance signal, which is emitted from the object 10 due to the applied high-frequency magnetic field. The MRI apparatus 110 outputs the obtained magnetic resonance signal to the image processing device 120.

The MRI apparatus 110 employs magnetic resonance of the atomic nucleus of the object 10. Magnetic resonance is a phenomenon by which an electromagnetic wave having a predetermined frequency is applied to atomic nuclei, which are regularly arranged in a static magnetic field. The electromagnetic wave excites the atomic nuclei to a high-energy state. As the atomic nuclei return to an original state, the atomic nuclei emit weak electromagnetic waves. Atoms that show magnetic resonance include, but are not limited to, 1H, 3HE, 19F, 23Na, 31 P, 13C, and 129Xe.

According to a non-exhaustive example, the MRI apparatus 110 generates a magnetic resonance image by using magnetic resonance signals emitted from different types of nuclei in the object 10, instead of just one type of nuclei.

The MRI apparatus 110 applies radio frequency (RF) pulses to the object 10. The RF pulses, which have different frequency bands for exciting each of the different types of nuclei, may simultaneously excite the different types of nuclei. The MRI apparatus 110 applies a predetermined pulse sequence to each of the different types of nuclei, and obtains magnetic resonance signals from the different types of nuclei. The image processing device 120 generates a magnetic resonance image of the object 10, by using the magnetic resonance signal received from the MRI apparatus 110.

According to a non-exhaustive example, the MRI apparatus 110 generates a magnetic resonance image, based on magnetic resonance signals obtained from a plurality of different types of nuclei, instead of just one type of nuclei. Accordingly, the MRI apparatus 110 may simultaneously obtain metabolic and anatomical information about the body.

Additionally, the MRI apparatus 110 obtains a plurality of pieces of biometric information, by using a magnetic resonance image, which is obtained by using a plurality of types of nuclei. Thus, the MRI apparatus 100 may use the plurality of pieces of biometric information for the diagnosis of diseases, such as lesions or tumors, which may be diagnosed by using particular nuclei.

The display device 130 receives a magnetic resonance image from the image processing device 120, and displays an image that shows tissue of the object 10. The display device 130 may be implemented as a liquid crystal display (LCD), a light-emitting diode (LED) display, a plasma display panel (PDP), a screen, a terminal, and the like. A screen may be a physical structure that includes one or more hardware components that provide the ability to render a user interface and/or receive user input. The screen can encompass any combination of display region, gesture capture region, a touch sensitive display, and/or a configurable area. The screen can be embedded in the hardware or may be an external peripheral device that may be attached and detached from the apparatus. The display may be a single-screen or a multi-screen display. A single physical screen can include multiple displays that are managed as separate logical displays permitting different content to be displayed on separate displays although part of the same physical screen.

The MRI system 100 may further include a user interface unit (not illustrated), which receives various control parameters for obtaining a magnetic resonance signal from a user. The user interface unit may also be responsible for inputting and outputting input information regarding a user and an image. The interface unit may include a network module for connection to a network and a universal serial bus (USB) host module for forming a data transfer channel with a mobile storage medium, depending on a function of the MRI system 100. In addition, the interface unit includes an input/output device such as a mouse, a keyboard, a touch screen, a monitor, a speaker, a screen, and a software module for running the input/output device.

The MRI system 100 may further include a storage unit (not illustrated) where magnetic resonance images, generated by the image processing device 120, may be stored. The storage unit may include, for example, a hard disk drive (HDD), a read only memory (ROM), a random access memory (RAM), a flash memory, or a memory card as an ordinary storage medium.

Figure 2:
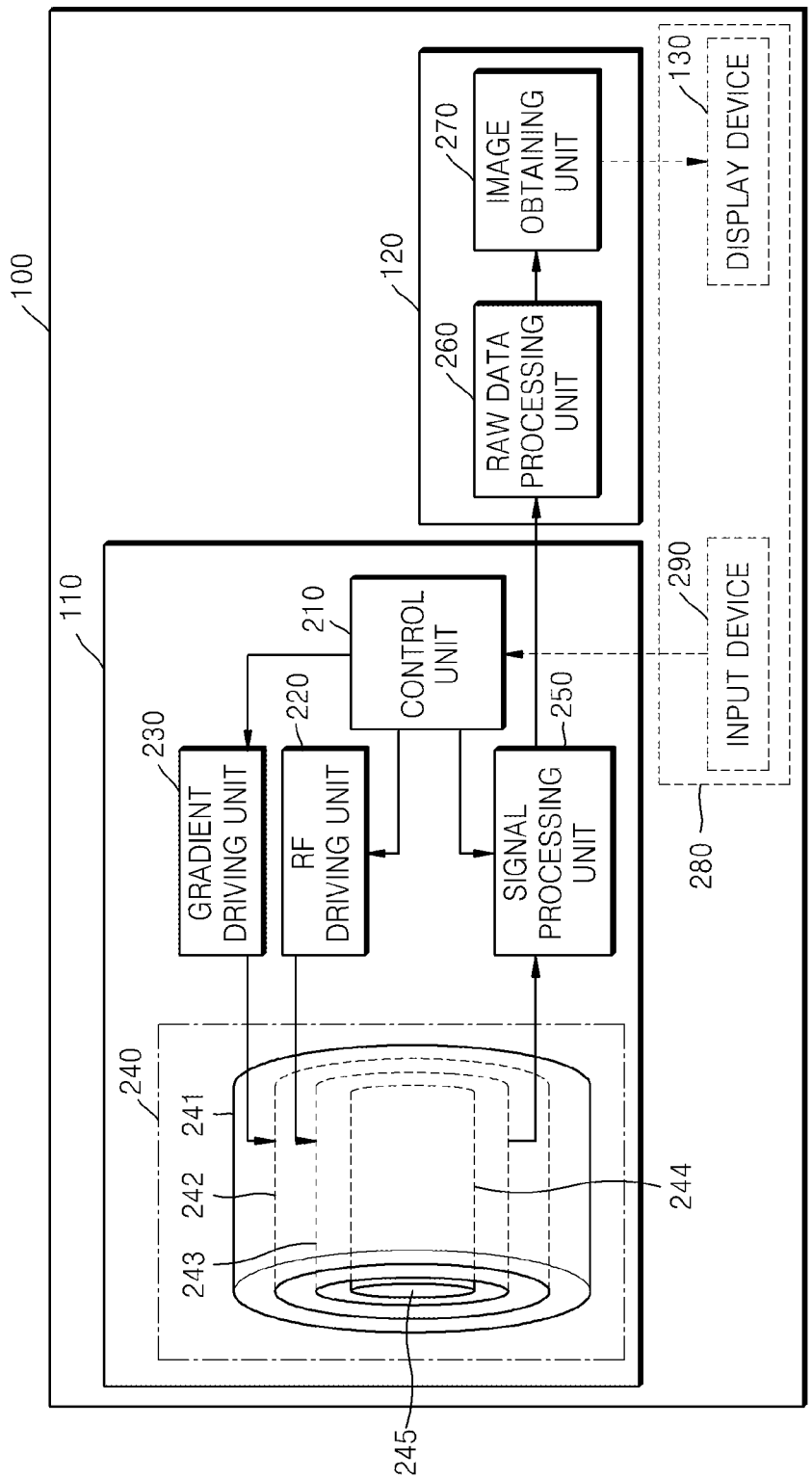
FIG. 2 is a diagram illustrating an example of a MRI system.

FIG. 2 is a diagram illustrating another example of an MRI system 100. Referring to FIG. 2, the MRI system 100 includes the MRI apparatus 110, the image processing device 120, and a user interface unit 280. The MRI apparatus 110 includes a control unit 210, an RF driving unit 220, a gradient driving unit 230, a magnet device 240, and a signal processing unit 250. The magnet device 240 includes a main magnetic field coil unit 241, a gradient coil unit 242, an RF transmitting (Tx) coil unit 243, and an RF receiving (Rx) unit 244. A bed (not illustrated) may slide an object 10 (not illustrated) into a bore 245 formed in the magnet device 240. The object 10 may be placed at a predetermined position on the bed.

The image processing device 120 includes a raw data processing unit 260 and an image obtaining unit 270. The user interface unit 280 includes an input device 290 and an output device 130. The MRI system 100, shown in FIG. 2, corresponds to an example of the MRI system 100 shown in FIG. 1. The description of FIG. 1 is also applicable to FIG. 2, and thus will not be repeated here.

The MRI system 100, using a magnetic field, obtains images that include information about tissue of an object without incision into the object. The MRI system 100 may obtain a two-dimensional (2D) image or a three-dimensional (3D) image, according to an applied pulse sequence. The MRI apparatus 110 subjects an object 10 to a magnetic field and applies an RF pulse and a predetermined pulse sequence to the object 10, to obtain magnetic resonance signals that are emitted from the object 10.

The control unit 210 controls all MRI operations of the MRI apparatus 100, such as, for example, applying an RF pulse, applying a pulse sequence to the object 10, and obtaining magnetic resonance signals. The control 210 applies a control signal to control the RF driving unit 220, the gradient driving unit 230, the magnet device 240, and the signal processing unit 250 included in the MRI apparatus 110.

The magnet device 240 applies a magnetic field, gradient signals, and RF pulses to the object 10 to obtain a magnetic resonance image of a tissue of the object 10. The magnet device 240 includes the main magnetic field coil unit 241, the gradient coil unit 242, the RF Tx coil unit 243, and the RF Rx unit 244. A form of a coil in the magnet device 240 is not limited to the illustration shown in FIG. 2, but the coil may be implemented in various forms.

The main magnetic field coil unit 241 generates a static magnetic field, so that nuclei in the object 10 are regularly arranged. Due to a magnetic field, which corresponds to a force exerted from the outside, the nuclei are arranged in a direction parallel or opposite to the magnetic field.

The gradient coil unit 242 applies a predetermined pulse sequence to each of the different types of nuclei. The gradient coil unit 242 applies gradient signals, for spatial encoding of a selection gradient, a phase encoding gradient, and a frequency encoding gradient, to the object 10.

The gradient coil unit 242 may apply three types of gradient signals along the directions of X, Y, and Z axes of the object 10. For example, the gradient coil unit 242 may obtain a tomographic image in a horizontal direction of the object 10, by applying gradient signals as described below.

The gradient coil unit 242 applies a selection gradient to a region of interest (ROI) of the object 10, of which a tomographic image is to be obtained, along the Z-axis, which is a vertical direction. With regard to a gradient magnetic field formed for the applied selection gradient, the gradient coil unit 242 applies a frequency encoding gradient in an X-axis direction and applies a phase encoding gradient in a Y-axis direction. Accordingly, the MRI system 100 may execute 2D spatial encoding and obtain a 2D magnetic resonance image.

As another non-exhaustive example, the gradient coil unit 242 may apply a phase encoding gradient in a Z-axis direction, in addition to a phase encoding gradient in a Y-axis direction. Accordingly, the MRI system 100 may execute 3D spatial encoding and obtain a 3D magnetic resonance image.

In addition to examples described above, the gradient coil unit 242 may apply various types of pulse sequences to the object 10. In the above description, as an example, the gradient coil unit 242 applies a selection gradient along a Z-axis. The examples described above are only non-exhaustive illustrations of the types of pulse sequences, and other types of pulse sequences are considered to be well within the scope of the present disclosure. For example, the gradient coil unit 242 may execute 2D or 3D spatial encoding by applying a selection gradient to an object, located in a static magnetic field, along a predetermined axis.

As described above, the gradient coil unit 242 may execute 2D or 3D spatial encoding by applying a predetermined pulse sequence to each of at least two or more different types of nuclei. The RF Tx coil unit 243 applies RF pulses, which have different frequency bands for each of at least two or more different types of nuclei to the object 10. The different types of nuclei are excited by different frequencies, according to a unique gyromagnetic ratio of each nucleus. Each frequency, by which the different types of nuclei are excited, is determined based on an intensity of the magnetic field Bo applied by the main magnetic field coil unit 241 and a unique gyromagnetic ratio γ of each nucleus. A frequency that excites nuclei of the object 10 is referred to as a procession frequency or a Larmor frequency. For example, when an intensity of the magnetic field, applied by the main magnetic field coil unit 241, is 1.0 Tesla (T), a Larmor frequency for exciting a hydrogen nucleus 1H is 42.6 MHz. On the other hand, a Larmor frequency for exciting a sodium nucleus 23Na is 11.3 MHz.

According to a non-exhaustive example, the RF Tx coil unit 243 may be formed of multi-channel RF coils. The RF Tx coil unit 243 applies RF pulses for each of the different types of nuclei to the object 10, via each channel of the multi-channel RF Tx coils. The RF pulses, applied to the object 10 via each channel of the multi-channel RF Tx coils, have a Larmor frequency that corresponds to each of the different types of nuclei.

According to a non-exhaustive example, the RF Tx coil unit 243 may apply a first RF pulse, which has a first frequency for exciting a hydrogen nucleus, to the object 10 via an RF coil of the first channel. The RF coil of the first channel may be formed of a plurality of coil elements. The RF Tx coil unit 243 may apply a second RF pulse, which has a second frequency for exciting a sodium nucleus, to the object 10 via an RF coil of the second channel. Likewise, the RF coil of the second channel may be formed of a plurality of coil elements. With regard to a different type of nuclei, the RF Tx coil unit 243 may apply an RF pulse, which has a Larmor frequency corresponding to a corresponding nucleus, to the object 10 via an RF coil with N channels. The RF Tx coil unit 243 may simultaneously excite each of a hydrogen nucleus, a sodium nucleus, and other types of nuclei of the object 10.

The RF Rx coil unit 244 receives the magnetic resonance signals emitted in response to the RF pulses that are applied to each of the different types of nuclei. The RF Rx coil unit 244 obtains an electromagnetic wave emitted by the nuclei when the nuclei, excited by the applied RF pulses, return to an original state. The electromagnetic wave obtained by the RF Rx coil unit 244 corresponds to a magnetic resonance signal. Magnetic resonance signals received by the RF Rx coil unit 244 are an electromagnetic wave emitted by different types of nuclei. The magnetic resonance signals include a plurality of frequency elements.

According to a non-exhaustive example, the RF Rx coil unit 244 may be formed of RF Rx coils. The RF Rx coil unit 244 receives all the magnetic resonance signals, emitted from the different types of nuclei via the RF Rx coils. The magnetic resonance signals received by the RF Rx coil unit 244 are transmitted to the signal processing unit 250. The signal processing unit 250 may separate the magnetic resonance signals received by using a filter into magnetic resonance signals that correspond to each of the different types of nuclei, according to corresponding frequency bands.

According to another non-exhaustive example, the RF Rx coil unit 244 may be formed of multi-channel RF Rx coils of N channels. The RF coils of each channel may be formed of a plurality of coil elements. Accordingly, the RF Rx coil unit 244 may receive magnetic resonance signals for each of the different types of nuclei via each channel of the multi-channel RF Rx coils. For example, the RF Rx coil of the first channel may receive magnetic resonance signals emitted by a first type of nuclei, and the RF Rx coil of the second channel may receive magnetic resonance signals emitted by a second type of nuclei. The RF Rx coil of the Nth channel may receive magnetic resonance signals emitted by an Nth type of nuclei, which is different from types of nuclei used for the first and second channels. Accordingly, the RF Rx coil unit 244 may receive magnetic resonance signals that correspond to each of the different types of nuclei for each channel, according to corresponding frequency bands.

The RF Rx coil unit 244 may include RF element coils in the form of fractals in order to improve coil sensitivity. For example, RF Rx coils or multi-channel RF Rx coils may have a form of fractals.

The signal processing unit 250 obtains magnetic resonance signals, output from the RF Rx coil unit 244, and executes various predetermined signal processing. For example, magnetic resonance signals, received by the RF Rx coil unit 244, are very weak, and thus, the signal processing unit 250 may amplify magnetic resonance signals obtained from the RF Rx coil unit 244 by using an amplifier. Additionally, the signal processing unit 250 may demodulate magnetic resonance signals by using a demodulator, or convert magnetic resonance signals to a digital form by using an analog-to-digital converter (ADC). As described above, the signal processing unit 250 may separate the magnetic resonance signals received by using a filter into magnetic resonance signals that correspond to each of the different types of nuclei, according to the corresponding frequency bands. The examples of signal processing executed by the signal processing unit 250 are only non-exhaustive illustrations of the types of signal processing, and other types of signal processing are considered to be well within the scope of the present disclosure. For example, the signal processing unit 250 may execute various other kinds of signal processing for magnetic resonance signals obtained by the RF Rx coil unit 244.

Magnetic resonance signals, output from the MRI apparatus 110, are raw data. Image processing is performed to generate an image of tissue of the object 10. The image processing device 120 executes image processing to generate an image from the magnetic resonance signals, which are output from the MRI apparatus 110. The image processing device 120 includes the raw data processing unit 260 and the image obtaining unit 270.

The raw data processing unit 260 forms a k-space, which includes location information, by using magnetic resonance signals output from the MRI apparatus 110. The image obtaining unit 270 generates an image of the object, by using image data that is processed at the raw data processing unit 260. The image obtaining unit 270 receives k-space data from the raw data processing unit 260, and performs a Fourier transform on the k-space data. Thus, the image obtaining unit 270 obtains a magnetic resonance image for tissue of the object 10.

The user interface unit 280 obtains input information from a user, and displays output information. For convenience of description, the input device 290 and the display device 130 are separate in FIG. 2. However, the input device 290 and the display device 130 are not limited thereto, and may be integrated and operated as one element.

The input device 290 may receive two or more types of nuclei to be used for MRI, from among a plurality of types of nuclei of the object 10, as input information, from a user. The input device 290 may receive various control parameters for determining a form of a predetermined pulse sequence applied to the object 10, via the gradient coil unit 242 and the RF Tx coil unit 243. According to another non-exhaustive example, the input device 290 may receive an ROI of the object 10, of which a magnetic resonance image is to be obtained, as input information. However, the input information is not limited thereto, and may receive various kinds of information as input information. The examples of input information received by the input device 290 are only non-exhaustive illustrations, and other types of input information are considered to be well within the scope of the present disclosure. The display device 130 displays an image of an object, generated by the image obtaining unit 270, and some examples of the display device are provided above. As other non-exhaustive examples, the display device 130 may include a device such as a display panel, or a monitor provided in the MRI system 100, and a software module thereof. Referring to FIG. 2, the MRI system 100 includes the display device 130. However, the display device 130 is not limited thereto, and the display device 130 may be provided outside the MRI system 100.

According to a non-exhaustive example, the MRI system 100 excites at least two or more nuclei, from among a plurality of types of nuclei of the object 10, and thus, obtains a magnetic resonance image. Thus, structural information and metabolic information about a body may be obtained simultaneously, without having to match different types of individual images such as PET-MRI images. The time and effort required to match individual images obtained for respective nuclei may be reduced, and differences in space and time for individual images and errors that may occur in matching may also be reduced. Thus, an accurate image may be obtained in a more efficient manner.

Moreover, when a particular cell in a body is to be tracked, or a cell activity such as migration or proliferation of a cell is to be observed, body structure information and cell information may be simultaneously obtained. Therefore, an accurate location of the cell may be obtained. For example, magnetic resonance signals are obtained by exciting a nucleus such as 3H3 or 129Xe, which is a hyperpolarized gas, simultaneously with a 1H nucleus. Thus, an image of gas exchange in a lung and an image of a lung tissue structure may be simultaneously obtained. Body structure information and cell information may be simultaneously obtained by exciting a plurality of types of nuclei. Thus, a cell may be observed and traced. Furthermore, an accurate diagnosis on diseases such as lesions or tumors can be made.

Figure 3:
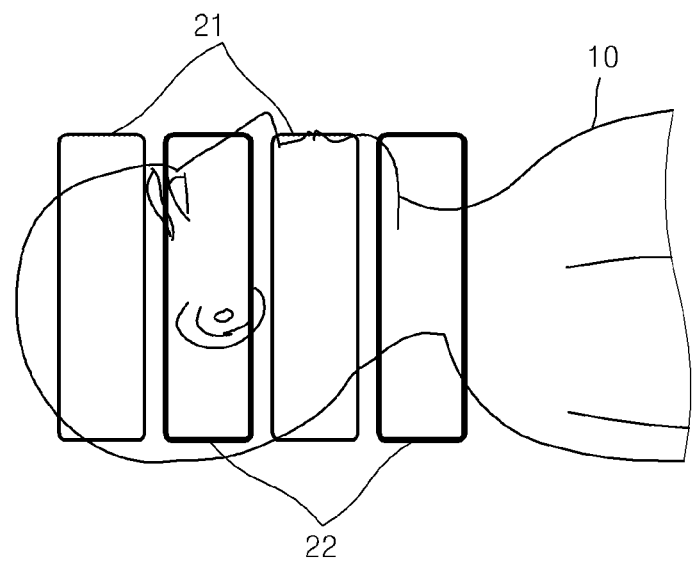
FIG. 3 is a diagram illustrating an example of a radio frequency (RF) transmitting (Tx) coil unit that applies RF pulses to an object.

FIG. 3 is a diagram illustrating an example of an RF Tx coil unit that applies RF pulses to an object. The RF Tx coil unit, shown in FIG. 3, is a non-exhaustive example of the RF Tx coil unit 243 shown in FIG. 2, and other types of RF Tx coil units are considered to be well within the scope of the present disclosure. The RF Tx coil unit, shown in FIG. 3, is formed of first channel Tx coil elements 21 and second channel Tx coil elements 22. The RF Tx coil unit applies RF pulses which have a frequency for exciting nuclei of the object 10.

The first channel Tx coil elements 21 may apply a first RF pulse, which has a first frequency for exciting a first nucleus, to the object 10. The second channel Tx coil elements 22 may apply a second RF pulse, which has a second frequency for exciting a different type of nucleus from the first nuclei, to the object 10. For example, the first channel Tx coil elements 21 may apply a first RF pulse, which has a first frequency for exciting a hydrogen nucleus, to the object 10. The second channel Tx coil elements 22 may apply a second RF pulse, which has a second frequency for exciting a sodium nucleus, to the object 10. However, a first frequency and a second frequency, applied by the first channel Tx coil elements 21 and the second channel Tx coil elements 22, may vary with nuclei. A hydrogen and sodium nuclei, in the current examples, are only used as non-exhaustive examples of different types of nuclei. As another non-exhaustive example, the first channel Tx coil elements 21 and the second channel Tx coil elements 22 may apply first frequency RF pulses and second frequency RF pulses for exciting nuclei such as a carbon nucleus or a phosphorous nucleus, to the object 10. The first frequency and the second frequency are determined based on an intensity of the magnetic field Bo, applied by the main magnetic field coil unit 241, and a unique gyromagnetic ratio γ of each nucleus which is to be excited by the first channel Tx coil elements 21 and the second channel Tx coil elements 22.

Figure 4:
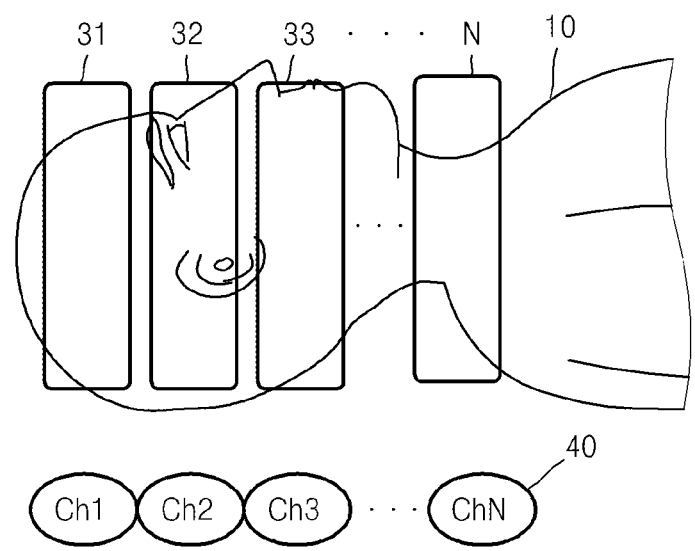
FIG. 4 is a diagram illustrating an example of a RF Tx coil unit, which applies RF pulses to an object, and an example of a RF receiving (Rx) coil unit, which receives magnetic resonance signals generated from the object by the applied RF pulses.

FIG. 4 is a diagram illustrating an example of an RF Tx coil unit, which applies RF pulses to an object, and an RF Rx coil unit, which receives magnetic resonance signals emitted from the object by the applied RF pulses. The RF Tx coil unit and the RF Rx coil unit, shown in FIG. 4, are only a non-exhaustive example of the RF Tx coil unit 243 and the RF Rx coil unit 244, shown in FIG. 2, and other types of RF Tx coil units and RF Rx coil units are considered to be well within the scope of the present disclosure.

The RF Tx coil unit, shown in FIG. 4, is formed of multi-channel Tx coil elements, which have N channels. The multi-channel Tx coil elements apply RF pulses having N frequencies. The N frequencies have different bands for exciting N different types of nuclei of object 10 via each channel. Accordingly, the MRI system 100 applies RF pulses having different frequencies via each channel of the multi-channel Tx coil elements, thus simultaneously exciting each of the different types of nuclei of object 10.

The RF Rx coil unit, shown in FIG. 4, is formed of multi-channel Rx coil elements 40, which have N channels. The multi-channel Rx coil elements 40 receive magnetic resonance signals that are emitted by RF pulses applied to each of N different types of nuclei. The multi-channel Rx coil elements 40 receive the magnetic resonance signals as the nuclei, excited by the applied RF pulses, return to an original state and emit magnetic resonance signals. The magnetic resonance signals, received by the multi-channel Rx coil elements 40, are magnetic resonance signals for each of N different types of nuclei. The magnetic resonance signals for each of N different types of nuclei have different frequency bands. Each of the magnetic resonance signals, for each type of nuclei, may be received via each channel of the multi-channel Rx coil elements 40.

For example, the RF Rx coil elements in a first channel may receive magnetic resonance signals emitted by first nuclei, and the RF Rx coil elements in a second channel may receive magnetic resonance signals emitted by a different type of nuclei from the first nuclei. Likewise, the RF Rx coil elements in an Nth channel may receive magnetic resonance signals emitted by a different type of nuclei from those used for the first and second channels. Accordingly, the multi-channel Rx coil elements 40 may receive magnetic resonance signals that correspond to each of the different types of nuclei.

Figure 5:
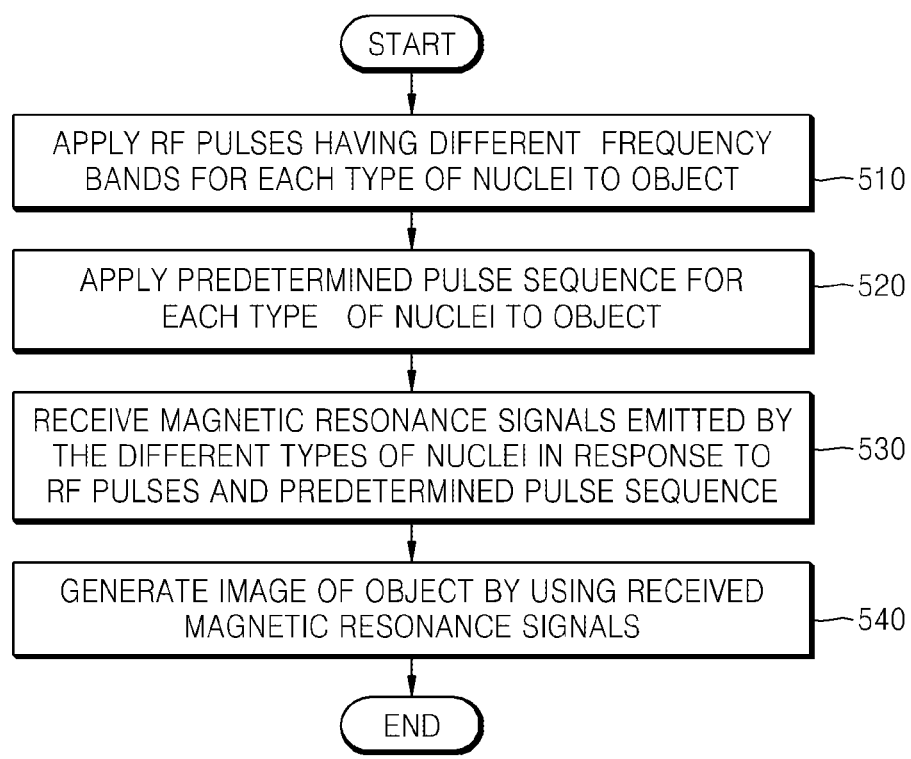
FIG. 5 is a diagram illustrating an example of a MRI method.

FIG. 5 is a diagram illustrating an example of a MRI method. Referring to FIG. 5, The MRI method of FIG. 5 includes operations processed in time series in the MRI system 100, shown in FIGS. 1 and 2. The operations in FIG. 5 may be performed in the sequence and manner as shown, although the order of some operations may be changed or some of the operations omitted without departing from the spirit and scope of the illustrative examples described. Many of the operations shown in FIG. 5 may be performed in parallel or concurrently. The description of FIGS. 1-4 is also applicable to FIG. 5, and thus will not be repeated here.

In 510, the MRI apparatus 110 applies RF pulses, which have different frequency bands for each of the different types of nuclei of an object to excite at least two or more different types of nuclei of the object 10. The object 10 is located inside a static magnetic field. The MRI apparatus 110 applies RF pulses for each of the different types of nuclei to the object 10, via each channel of multi-channel RF Tx coils.

In 520, the MRI apparatus 110 applies predetermined pulse sequences to each of the different types of nuclei. The MRI system 100 may obtain a 2D image or a 3D image, according to the applied pulse sequences. The MRI apparatus 110 applies predetermined pulse sequences for spatial encoding of a selection gradient, a phase encoding gradient, and a frequency encoding gradient to the object 10, for each of the different types of nuclei.

In 530, the MRI apparatus 110 receives magnetic resonance signals, emitted by each of the different types of nuclei because of the application of the RF pulses and predetermined pulse sequences. The MRI apparatus 110 may receive magnetic resonance signals for different types of nuclei via each channel of multi-channel RF Rx coils, or it may receive the magnetic resonance signals from different types of nuclei via RF Rx coils. The MRI apparatus 110 may separate the received magnetic resonance signals into magnetic resonance signals, which correspond to each of the different types of nuclei, according to corresponding frequency bands. Thus, the MRI apparatus 110 may obtain the magnetic resonance signals for each of the different types of nuclei.

In 540, the image processing device 120 generates an image of the object by using the received magnetic resonance signals. Accordingly, the MRI apparatus 110 generates a magnetic resonance image, based on magnetic resonance signals obtained from a plurality of nuclei of the object 10, instead of just one type of nuclei.

FIG. 6 is a diagram illustrating an example of a MRI method. Referring to FIG. 6, the MRI method includes operations processed in time series in the MRI system 100, shown in FIGS. 1 and 2. The operations in FIG. 6 may be performed in the sequence and manner as shown, although the order of some operations may be changed or some of the operations omitted without departing from the spirit and scope of the illustrative examples described. Many of the operations shown in FIG. 6 may be performed in parallel or concurrently. The description of FIGS. 1-5 is also applicable to FIG. 6, and thus will not be repeated here.

In 610, the MRI apparatus 110 applies a first RF pulse, which has a first frequency, for exciting a hydrogen nucleus of an object located inside a static magnetic field, and a second RF pulse, which has a second frequency, for exciting a sodium nucleus of the object, to the object. In another non-exhaustive example, the MRI apparatus 110 may simultaneously apply RF pulses, which have frequencies corresponding to each of the different types of nuclei, to the object 10, by using multi-channel RF Tx coils.

In 620, the MRI apparatus 110 applies a predetermined pulse sequence for the hydrogen nuclei and sodium nuclei. The MRI system 100 may obtain a 2D image or a 3D image, according to the applied pulse sequence.

In 630, the MRI apparatus 110 receives a first magnetic resonance signal, emitted by the hydrogen nuclei in response to the first RF pulse, and a second magnetic resonance signal, emitted by the sodium nuclei in response to the second RF pulse.

In 640, the image processing device 120 generates an image of the object by using the received first magnetic resonance signal and the second magnetic resonance signal. Accordingly, the MRI apparatus 110 may generate a magnetic resonance image, by using magnetic resonance signals emitted from different types of nuclei of the object 10, instead of just one type of nuclei.

As described above, magnetic resonance signals may be obtained from the plurality of types of nuclei, by using a magnetic resonance imaging system for simultaneously exciting a plurality of types of nuclei of an object. Thus, metabolic information about a body and anatomical information may be simultaneously obtained.

When a particular cell in a body is to be tracked, or cell activity such as migration or proliferation of a cell is to be observed, as body structure information and cell information are simultaneously obtained, an accurate location of the cell may be obtained. Accordingly, an accuracy of a diagnosis on diseases such as lesions or tumors, which may be diagnosed by using particular elements, can be improved.

Additionally, a magnetic resonance image, which includes a plurality of pieces of biometric information, may be obtained by using a plurality of types of nuclei. Accordingly, the time and effort required to match individual images obtained for respective nuclei may be reduced, and differences in space and time for individual images and errors that may occur in matching may be reduced. Thus, an accurate image may be obtained. Thus, a plurality of pieces of biometric information may be obtained and used for the diagnosis of diseases such as lesions or tumors, which may be diagnosed by using particular elements.

The methods described above can be written as a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device that is capable of providing instructions or data to or being interpreted by the processing device. The software also may be distributed over network coupled computer systems so that the software is stored and executed in a distributed fashion. In particular, the software and data may be stored by one or more non-transitory computer readable recording mediums. The non-transitory computer readable recording medium may include any data storage device that can store data that can be thereafter read by a computer system or processing device. Examples of the non-transitory computer readable recording medium include read-only memory (ROM), random-access memory (RAM), Compact Disc Read-only Memory (CD-ROMs), magnetic tapes, USBs, floppy disks, hard disks, optical recording media (e.g., CD-ROMs, or DVDs), and PC interfaces (e.g., PCI, PCI-express, WiFi, etc.). In addition, functional programs, codes, and code segments for accomplishing the example disclosed herein can be construed by programmers skilled in the art based on the flow diagrams and block diagrams of the figures and their corresponding descriptions as provided herein.

The apparatuses and units described herein may be implemented using hardware components. The hardware components may include, for example, controllers, sensors, processors, generators, drivers, and other equivalent electronic components. The hardware components may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a hardware component may include multiple processors or a processor and a controller. In addition, different processing configurations are possible, such a parallel processors.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A magnetic resonance imaging (MRI) method comprising:

applying radio frequency (RF) pulses to an object in a magnetic field, the RF pulses having different frequency bands for each of at least two types of nucleus in the object;

applying predetermined pulse sequences for each type of nucleus to the object;

receiving magnetic resonance signals emitted by each nucleus in response to the RF pulses and the predetermined pulse sequences; and generating an image of the object based on the received magnetic resonance signals, wherein metabolic information and anatomical information about the object is simultaneously obtained from the generated image.

2. The method of claim 1, wherein the applying of the RF pulses comprises applying the RF pulses for each type of nucleus through each channel of multi-channel RF transmitting (Tx) coils.

3. The method of claim 1, wherein the applying of the RF pulses comprises simultaneously applying the RF pulses through multi-channel RF transmitting (Tx) coils.

4. The method of claim 1, wherein the receiving of the magnetic resonance signals comprises receiving the magnetic resonance signals for each type of nucleus, through each channel of multi-channel RF receiving (Rx) coils.

5. The method of claim 4, wherein the multi-channel RF Rx coils have a form of fractals.

6. The method of claim 1, wherein the receiving of the magnetic resonance signals comprises:

receiving the magnetic resonance signals through RF receiving (Rx) coils; and separating the received magnetic resonance signals into a plurality of magnetic resonance signals corresponding to each type of nucleus, based on frequency bands of the received magnetic resonance signals.

7. The method of claim 6, wherein the multi-channel RF Rx coils have a form of fractals.

8. The method of claim 1, wherein a frequency band corresponding to each type of nucleus is determined based on an intensity of a static magnetic field applied to the object and a gyromagnetic ratio of each types of nucleus.

9. A non-transitory computer-readable storage medium storing instructions that, when executed by a processor, cause the processor to perform the method of claim 1.

10. The method of claim 1, wherein the predetermined pulse sequences comprises at least one of a frequency encoding pulse or a phase encoding pulse.

11. The method of claim 10, wherein the phase encoding pulse comprises at least one of a phase encoding pulse along the direction of a Y-axis or a phase encoding pulse along the direction of an X-axis.

12. A magnetic resonance imaging (MRI) apparatus comprising:

a controller configured to determine pulse sequences for at least two different types of nucleus applied to an object placed in a magnetic field;

a radio frequency (RF) transmitting (Tx) coil configured to apply RF pulses having different frequency bands for each of the at least two different types of nucleus of the object;

an RF receiving (Rx) coil configured to receive magnetic resonance signals emitted by each type of nucleus in response to the RF pulses and the pulse sequences; and a signal processor configured to process the magnetic resonance signals received from the RF Rx coil, and to transmit the processed magnetic resonance signals to a image processor generating a magnetic resonance image of the object, wherein metabolic information and anatomical information about the object is simultaneously obtained from the generated image by the image processor.

13. The MRI apparatus of claim 12, wherein the RF Tx coil comprises multi-channel RF Tx coils, and the RF Tx coil is configured to apply the RF pulses for each type of nucleus through each channel of the multi-channel RF Tx coils.

14. The MRI apparatus of claim 12, wherein the RF Tx coil comprises multi-channel RF Tx coils, and the multi-channel RF Tx coils are configured to simultaneously apply the RF pulses having different frequency bands corresponding to each type of nucleus.

15. The MRI apparatus of claim 12, wherein the RF Rx coil comprises multi-channel RF Rx coils, and the RF Rx coil is configured to receive the magnetic resonance signals for each type of nucleus through each channel of the multi-channel RF Rx coils.

16. The MRI apparatus of claim 15, wherein the multi-channel RF Rx coils have a form of fractals.

17. The MRI apparatus of claim 12, wherein the RF Rx coil comprises multi-channel RF Rx coils, the RF Rx coil receives the magnetic resonance signals through the multi-channel RF Rx coils, and the signal processor is further configured to separate the received magnetic resonance signals into a plurality of magnetic resonance signals corresponding to each type of nucleus, based on frequency bands of the received magnetic resonance signals.

18. The MRI apparatus of claim 17, wherein the multi-channel RF Rx coils have a form of fractals.

19. The MRI apparatus of claim 17, the signal processor separates the received magnetic resonance signals into a plurality of magnetic resonance signals using filters.

20. A magnetic resonance imaging (MRI) system comprising:

an MRI apparatus configured:

to apply radio frequency (RF) pulses having different frequency bands for each of at least two type of nucleus to an object in a magnetic field, to apply predetermined pulse sequences for each type of nucleus, and to receive magnetic resonance signals emitted by each type of nucleus in response to the RF pulses and the predetermined pulse sequences; and an image processor configured to generate an image of the object based on the received magnetic resonance signals, wherein metabolic information and anatomical information about the object is simultaneously obtained from the generated image by the image processor.

* * * * *